(12) United States Patent
Hsieh et al.

(10) Patent No.: US 10,037,975 B2
(45) Date of Patent: Jul. 31, 2018

(54) SEMICONDUCTOR DEVICE PACKAGE AND A METHOD OF MANUFACTURING THE SAME

(71) Applicant: Advanced Semiconductor Engineering, Inc., Kaohsiung (TW)

(72) Inventors: Wei-Ming Hsieh, Kaohsiung (TW); Yu-Pin Tsai, Kaohsiung (TW); Man-Wen Tseng, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 15/675,617

(22) Filed: Aug. 11, 2017

(65) Prior Publication Data

US 2018/0061813 A1 Mar. 1, 2018

(51) Int. Cl.
| | |
|---|---|
| *H01L 23/00* | (2006.01) |
| *H01L 25/065* | (2006.01) |
| *H01L 23/31* | (2006.01) |
| *H01L 23/498* | (2006.01) |

(52) U.S. Cl.
CPC ...... *H01L 25/0657* (2013.01); *H01L 23/3114* (2013.01); *H01L 23/49838* (2013.01); *H01L 23/562* (2013.01); *H01L 2225/06513* (2013.01); *H01L 2225/06586* (2013.01)

(58) Field of Classification Search
CPC .................................................. H01L 25/0657
See application file for complete search history.

(56) References Cited

U.S. PATENT DOCUMENTS

| | | | |
|---|---|---|---|
| 7,476,980 | B2 | 1/2009 | Rebibis et al. |
| 8,039,315 | B2 | 10/2011 | Lee et al. |
| 9,177,926 | B2 | 11/2015 | Scanlan et al. |
| 9,269,622 | B2 | 2/2016 | Scanlan et al. |
| 9,337,086 | B2 | 5/2016 | Scanlan |
| 2008/0284017 | A1* | 11/2008 | Lee ............... H01L 21/6835 257/738 |

* cited by examiner

*Primary Examiner* — William Harriston
(74) *Attorney, Agent, or Firm* — Foley & Lardner LLP; Cliff Z. Liu (57) ABSTRACT

A semiconductor device package including a first encapsulation layer, a redistribution layer disposed on the first encapsulation layer, a first die disposed on the redistribution layer, a second encapsulation layer covering the first die and the redistribution layer, and an electrical connection terminal electrically connected to the redistribution layer. The first encapsulation layer has a first surface and a second surface different from the first surface. The first encapsulation layer surrounds a portion of the electrical connection terminal and exposes the electrical connection terminal.

18 Claims, 11 Drawing Sheets

| Sample | Silicon wafer (Non-grinding) | Lower encapsulation layer 10 (Non-curing & Non-grinding) | Lower encapsulation layer 10 (Curing & Non-grinding) | Lower encapsulation layer 10 (Non-curing & Grinding) | Lower encapsulation layer 10 (Curing & Grinding) |
|---|---|---|---|---|---|
| Angle value | 63°~69° | 92°~108° | 92°~105° | 36°~39° | 39°~41° |

FIG. 5

| Sample | Non-grinding | Sawing | Grinding |
|---|---|---|---|
| Contact angle | 104.4° | 55.7° | 39.5° |

FIG. 6

| Sample | Non-grinding | Sawing | Grinding |
|---|---|---|---|
| Roughness | 0.279μm | 0.214μm | 0.091μm |

SEMICONDUCTOR DEVICE PACKAGE AND A METHOD OF MANUFACTURING THE SAME

CROSS-REFERENCE TO RELATED APPLICATIONS

This application claims the benefit of and priority to U.S. Provisional Application No. 62/382,004, filed Aug. 31, 2016, the content of which is incorporated herein by reference in its entirety.

BACKGROUND

1. Technical Field

The present disclosure relates to a semiconductor device package, and to a semiconductor device package having a mold compound carrier supporting semiconductor dies.

2. Description of the Related Art

In a semiconductor device package, a mold compound can be used to encapsulate semiconductor dies and/or other components on a substrate. A coefficient of thermal expansion (CTE) mismatch between the mold compound, the substrate, the semiconductor dies, and/or other components of the semiconductor device package may cause warpage, which may cause reliability issues of the semiconductor device package. To address such warpage issues, a quantity of fillers in the mold compound can be increased to mitigate the warpage; however, this may also increase viscosity of the mold compound which can hinder the molding operation. Another potential solution is to introduce relatively hard material (e.g. Naphthalene) into a resin of the mold compound; however, if there is deformation of such a relatively hard mold compound, it may be challenging to handle the subsequent operations (e.g. in a vacuum pickup transfer operation). Another potential solution to deal with the warpage issue may use a glass carrier which has good coplanarity, thermostability, acid-resistance and alkali-resistance. However, the glass carrier may be fragile and therefore easily broken during the manufacturing process. Another potential solution to deal with the warpage issue may use a metal carrier which is reusable and has low CTE when operating in a temperature from, for example, about 20 degrees Celsius (° C.) to about 300° C. However, such a metal carrier can be expensive and can have relatively poor coplanarity. Moreover, extra bonding and de-bonding operations may be introduced into the manufacturing process when the metal carrier or the glass carrier is used, and accordingly, a cost of manufacture may be increased.

SUMMARY

In some embodiments, according to one aspect, a semiconductor device package includes a first encapsulation layer, a redistribution layer disposed on the first encapsulation layer, a first die disposed on the redistribution layer, a second encapsulation layer covering the first die and the distribution layer, and an electrical connection terminal electrically connected to the redistribution layer. The first encapsulation layer has a first surface and a second surface different from the first surface. The first encapsulation layer surrounds the electrical connection terminal and exposes the electrical connection terminal.

In some embodiments, according to another aspect, a method for manufacturing a semiconductor device package includes providing a first encapsulation layer, forming a redistribution layer on the first encapsulation layer, and disposing a die on the redistribution layer. The method further includes forming a second encapsulation layer encapsulating the die, forming a first opening in the first encapsulation layer, and forming an electrical connection terminal electrically connected to the redistribution layer in the first opening, wherein the first encapsulation layer surrounds the electrical connection terminal and exposes a portion of the electrical connection terminal.

DETAILED DESCRIPTION

Common reference numerals are used throughout the drawings and the detailed description to indicate the same or similar components. Embodiments of the present disclosure will be readily understood from the following detailed description taken in conjunction with the accompanying drawings.

Spatial descriptions, such as "above," "below," "up," "left," "right," "down," "top," "bottom," "vertical," "horizontal," "side," "higher," "lower," "upper," "over," "under," and so forth, are specified with respect to a certain component or group of components, or a certain plane of a component or group of components, for the orientation of the component(s) as shown in the associated figure. It should be understood that the spatial descriptions used herein are for purposes of illustration only, and that practical implementations of the structures described herein can be spatially arranged in any orientation or manner, provided that the merits of embodiments of this disclosure are not deviated from by such arrangement.

Figure 1:
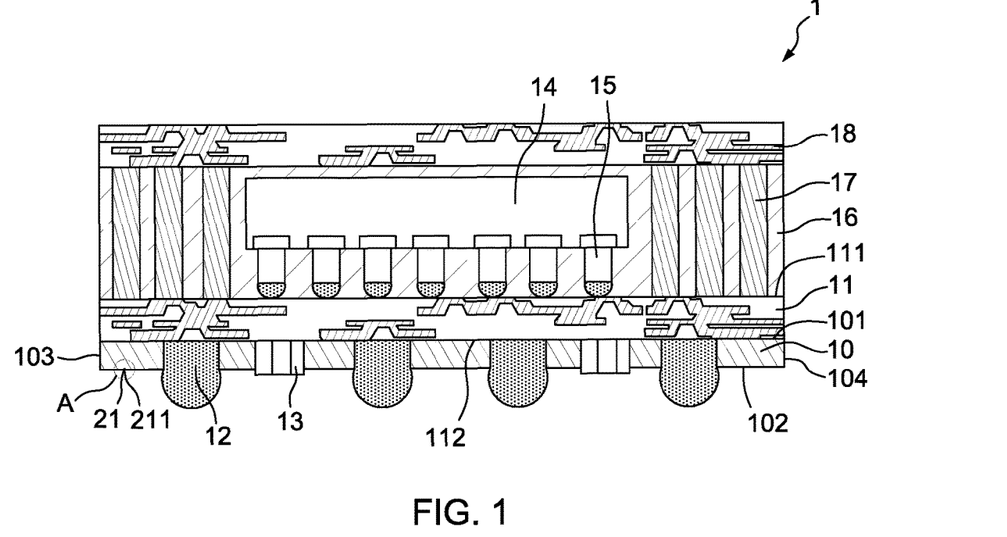
FIG. 1 illustrates a cross-sectional view of a semiconductor device package according to some embodiments of the present disclosure.

FIG. 1 is a cross-sectional view of a semiconductor device package 1 in accordance with some embodiments of the present disclosure. The semiconductor device package 1 includes a lower encapsulation layer 10, a lower redistribution structure 11, an electrical connection terminal 12, an electronic component 13, a die 14, a first interconnection 15, an upper encapsulation layer 16, a second interconnection 17, and an upper redistribution structure 18.

The lower encapsulation layer 10 has a top surface 101, a bottom surface 102, a lateral surface 103, and a lateral surface 104. The top surface 101 is opposite to the bottom surface 102. The lateral surface 103 and the lateral surface 104 are opposite to each other. The lower encapsulation layer 10 defines openings that receive the electrical connection terminal 12 and the electronic component 13. In some embodiments, the electrical connection terminal 12 may include a solder paste, a solder ball, a joint material, or other suitable elements. The electronic component 13 may include a passive device, such as a capacitor, an inductor, or a resistor. The electronic component 13 includes at least two terminals electrically connected to the lower redistribution layer 11. The lower encapsulation layer 10 can function as a supporting layer that surrounds and supports the electrical connection terminal 12 and the electronic component 13. The electrical connection terminal 12 may be, in some embodiments, a terminal of the electronic component 13. The lower encapsulation layer 10 exposes at least a portion of the electrical connection terminal 12 and the electronic component 13 (e.g. the lower encapsulation layer 10 exposes a top surface of the electrical connection terminal 12 and a top surface of the electronic component 13). A height of the electrical connection terminal 12 is greater than a height of the electronic component 13. A ratio of a height or a thickness of the lower encapsulation layer 10 to a height of the electrical connection terminal 12 is in a range from approximately 20% to approximately 40%. The electrical connection terminal 12 may protrude below a lower end of the electronic component 13. A top surface of the electrical connection terminal 12 and a top surface of the electronic component 13 may be substantially coplanar. The electrical connection terminal 12 and the electronic component 13 are surrounded and supported by the lower encapsulation layer 10, and thus the electrical connection terminal 12 or the electronic component 13 may be secured in the semiconductor device package 1, which may increase the reliability of the semiconductor device package 1.

The lower encapsulation layer 10 may function as a mold compound carrier for supporting the die 14. The lower encapsulation layer 10 is adjacent to the lower redistribution structure 11 and is disposed under the upper encapsulation layer 16. The lower encapsulation layer 10 includes an epoxy resin and silicon dioxide ($SiO_2$) fillers 21. The thickness of the lower encapsulation layer 10 can be set as appropriate. The thickness of the lower encapsulation layer 10 can be readily changed. For example, in some embodiments, the bottom surface 102 of the lower encapsulation layer 10 is grinded to a desired thickness. A contact angle of the bottom surface 102 of the lower encapsulation layer 10 is different from a contact angle of the top surface 101 of the second encapsulation layer 10. For example, a contact angle of the bottom surface 102 of the lower encapsulation layer 10 is less than a contact angle of the top surface 101 of the lower encapsulation layer 10. In some embodiments, the top surface 101 of the lower encapsulation layer 10 can be grinded. The contact angle of the bottom surface 102 of the lower encapsulation layer 10 is different from a contact angle of the lateral surface 103 or 104 of the lower encapsulation layer 10. For example, the contact angle of the bottom surface 102 of the lower encapsulation layer 10 is less than a contact angle of the lateral surface 103 or 104 of the lower encapsulation layer 10.

The upper encapsulation layer 16 includes an epoxy resin. Material characteristics of the upper encapsulation layer 16 may be similar to those of the lower encapsulation layer 10. In some embodiments, a CTE of the upper encapsulation layer 16 is different from a CTE of the lower encapsulation layer 10. In some embodiments, the CTE of the upper encapsulation layer 16 is substantially the same as the CTE of the lower encapsulation layer 10. In some embodiments, the CTE of the upper encapsulation layer 16 is greater than the CTE of the lower encapsulation layer 10. In some embodiments, the CTE of the upper encapsulation layer 16 is less than the CTE of the lower encapsulation layer 10. In implementations in which material characteristics (e.g. CTEs) of the upper encapsulation layer 16 are similar to or substantially the same as those of the lower encapsulation layer 10, CTE mismatch between the upper encapsulation layer 16 and the lower encapsulation layer 10 can be kept small. Thus the strength of the lower encapsulation layer 10 used as a mold compound carrier may be increased and the reliability of the lower encapsulation layer 10 can be stable during molding operations, which can help to avoid warpage issues and reduce the costs for manufacturing the semiconductor device package 1.

The lower redistribution layer 11 is disposed on the lower encapsulation layer 10. The lower redistribution layer 11 has a top surface 111 and a bottom surface 112 opposite to the top surface 111.

The die 14 is disposed on the top surface 111 of the lower redistribution layer 11. The die 14 is electrically connected to the lower redistribution layer 11 via the first interconnection 15. The die 14 may include an application-specific integrated circuit (ASIC), a controller, a processor or other electronic component or semiconductor device.

The upper encapsulation layer 16 is disposed on the lower redistribution layer 11. The second interconnection 17 is disposed in the upper encapsulation layer 16. The upper redistribution structure 18 is disposed on the upper encapsulation layer 16. The second interconnection 17 is electrically connected to the lower redistribution layer 11 and the upper redistribution structure 18. The upper encapsulation layer 16 encapsulates, or covers, at least a portion of the lower redistribution layer 11, the die 14, the first interconnection 15, and the second interconnection 17. The first interconnection 15 and the second interconnection 17 may include a conductive material, such as copper (Cu), tin (Sn), another metal, and/or other suitable materials.

Figure 2:
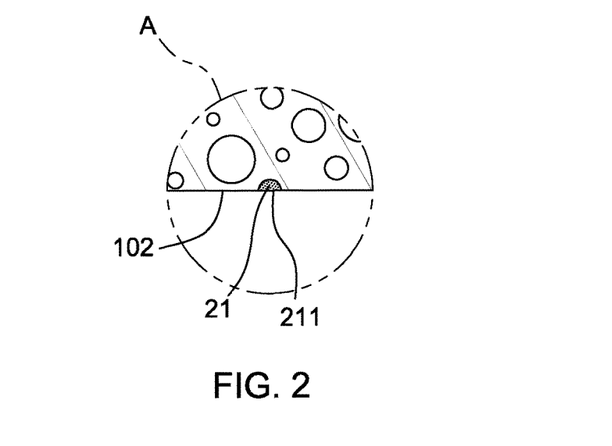
FIG. 2 illustrates a cross-sectional view of an encapsulation layer according to some embodiments of the present disclosure.

FIG. 2 is an enlarged cross-sectional view of the lower encapsulation layer 10 in a dotted-circle A illustrated in FIG. 1, according to some embodiments of the present disclosure. The lower encapsulation layer 10 includes the fillers 21. A size (e.g. a diameter) of the fillers 21 typically varies from about 10 micrometers (μm) to about 100 μm. In implementations in which the bottom surface 102 of the lower encapsulation layer 10 is grinded by a grinding technique, the filler 21 exposed from the bottom surface 102 of the lower encapsulation layer 10 has a planar surface 211. The planar surface 211 of the filler 21 is substantially coplanar with the bottom surface 102 of the lower encapsulation layer 10.

Figure 3:
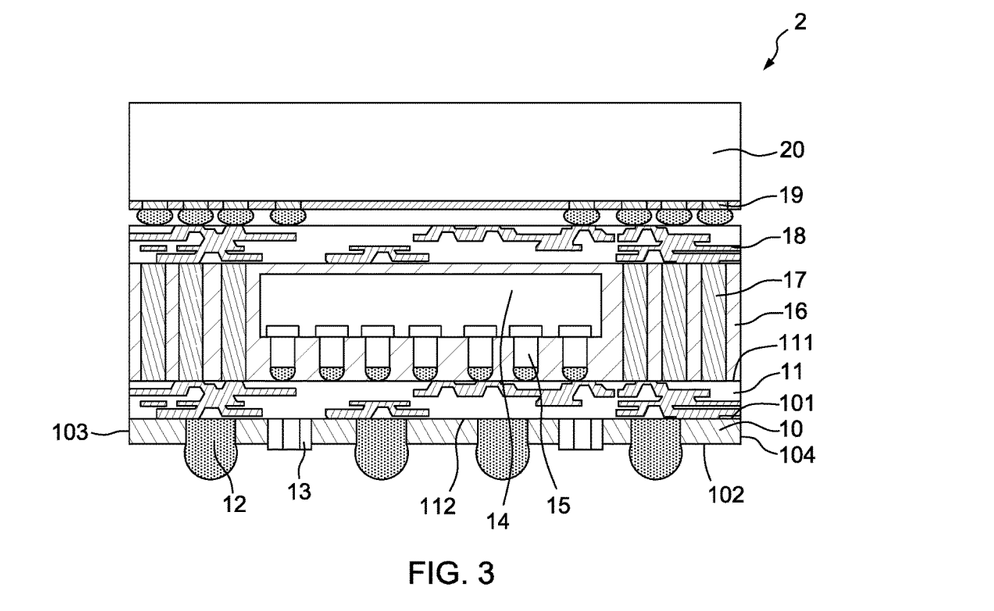
FIG. 3 illustrates a cross-sectional view of a semiconductor device package according to some embodiments of the present disclosure.

FIG. 3 is a cross-sectional view of a semiconductor device package 2 in accordance with some embodiments of the present disclosure. The semiconductor device package 2 includes a lower encapsulation layer 10, a lower redistribution structure 11, an electrical connection terminal 12, an electronic component 13, a first die 14, a first interconnection 15, an upper encapsulation layer 16, a second interconnection 17, an upper redistribution structure 18, a third interconnection 19, and a second die 20.

The depicted structure of FIG. 3 is similar to the structure depicted in FIG. 1, except that it includes the second die 20 disposed on the upper redistribution structure 18 via the third interconnection 19. In some embodiments, the second die 20 may include a memory device or a semiconductor device stack.

Similarly to the structure of the lower encapsulation layer 10 depicted in FIG. 1, the lower encapsulation layer 10 of the semiconductor device package 2 may function as a mold compound carrier for supporting the first die 14. The lower encapsulation layer 10 is adjacent to the lower redistribution structure 11 and is disposed under the upper encapsulation layer 16. The lower encapsulation layer 10 includes an epoxy resin and fillers 21. The thickness of the lower encapsulation layer 10 can be set as appropriate. The thickness of the lower encapsulation layer 10 can be readily changed. For example, in some embodiments, the bottom surface 102 of the lower encapsulation layer 10 is grinded to a desired thickness. A contact angle of the bottom surface 102 of the lower encapsulation layer 10 is different from a contact angle of the top surface 101 of the lower encapsulation layer 10. For example, a contact angle of the bottom surface 102 of the lower encapsulation layer 10 is less than a contact angle of the top surface 101 of the lower encapsulation layer 10. In some embodiments, the top surface 101 of the lower encapsulation layer 10 is grinded. The contact angle of the bottom surface 102 of the lower encapsulation layer 10 is different from a contact angle of the lateral surface 103 or 104 of the lower encapsulation layer 10. For example, the contact angle of the bottom surface 102 of the lower encapsulation layer 10 is less than a contact angle of the lateral surface 103 or 104 of the lower encapsulation layer 10.

The upper encapsulation layer 16 includes an epoxy resin. Material characteristics of the upper encapsulation layer 16 may be similar to those of the lower encapsulation layer 10. In some embodiments, a CTE of the upper encapsulation layer 16 is different from a CTE of the lower encapsulation layer 10. In some embodiments, the CTE of the upper encapsulation layer 16 is substantially the same as the CTE of the lower encapsulation layer 10. In some embodiments, the CTE of the upper encapsulation layer 16 is greater than the CTE of the lower encapsulation layer 10. In some embodiments, the CTE of the upper encapsulation layer 16 is less than the CTE of the lower encapsulation layer 10. In implementations in which material characteristics (e.g. CTEs) of the upper encapsulation layer 16 are similar to or substantially the same as those of the lower encapsulation layer 10, CTE mismatch between the upper encapsulation layer 16 and the lower encapsulation layer 10 can be kept small. Thus the strength of the lower encapsulation layer 10 used as a mold compound carrier may be increased and the reliability of the lower encapsulation layer 10 may be stable during molding operations, which can help to avoid warpage issues and reduce costs for manufacturing the semiconductor device package 2.

Figure 4A:
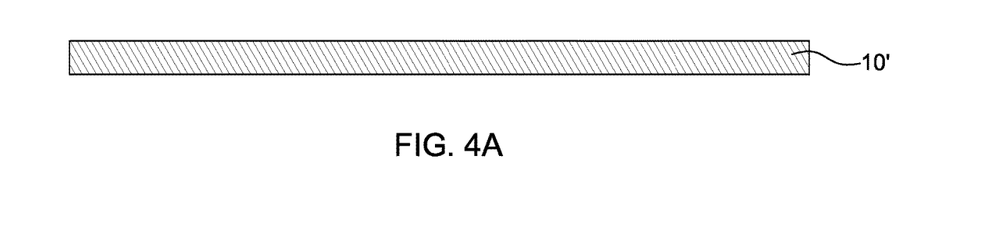
FIG. 4A illustrates some embodiments of a method of manufacturing a semiconductor device package according to some embodiments of the present disclosure.
Figure 4B:
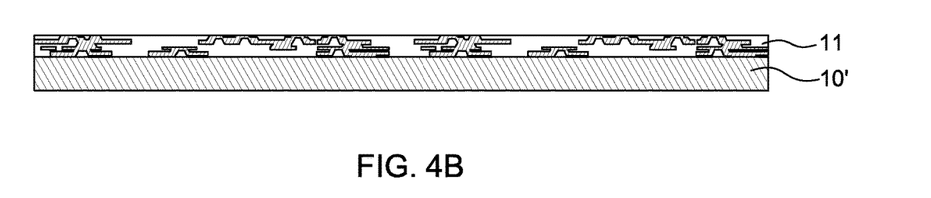
FIG. 4B illustrates some embodiments of a method of manufacturing a semiconductor device package according to some embodiments of the present disclosure.
Figure 4C:
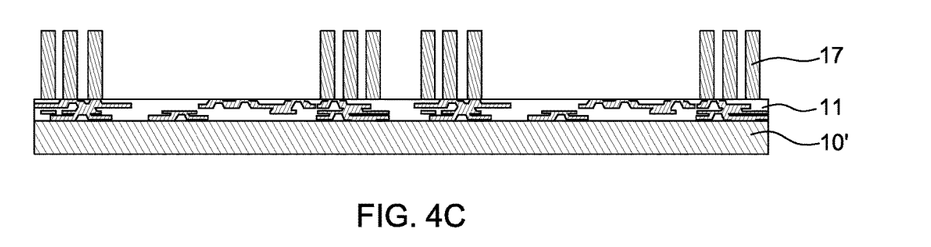
FIG. 4C illustrates some embodiments of a method of manufacturing a semiconductor device package according to some embodiments of the present disclosure.
Figure 4D:
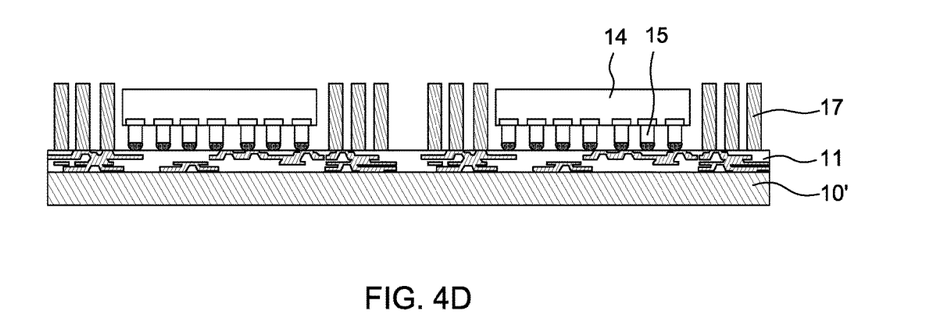
FIG. 4D illustrates some embodiments of a method of manufacturing a semiconductor device package according to some embodiments of the present disclosure.
Figure 4E:
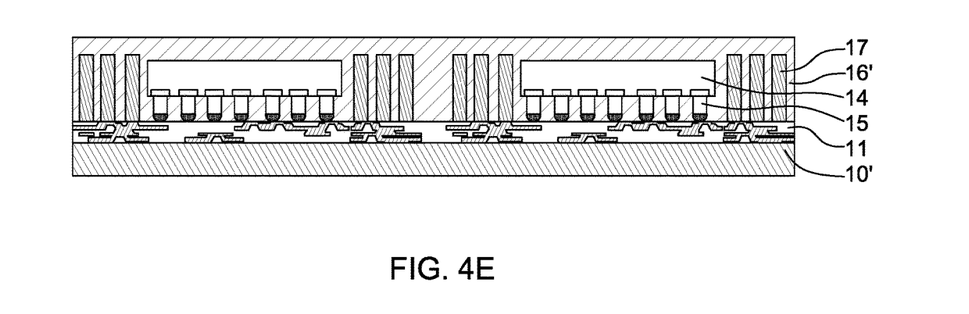
FIG. 4E illustrates some embodiments of a method of manufacturing a semiconductor device package according to some embodiments of the present disclosure.
Figure 4F:
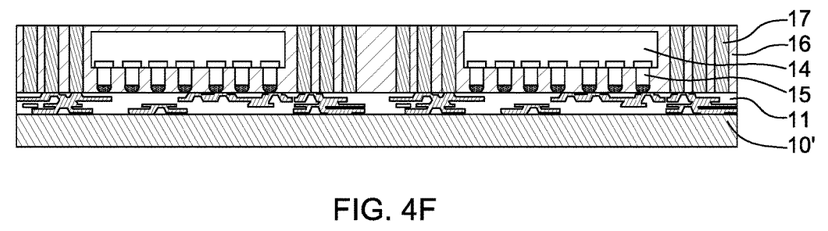
FIG. 4F illustrates some embodiments of a method of manufacturing a semiconductor device package according to some embodiments of the present disclosure.
Figure 4G:
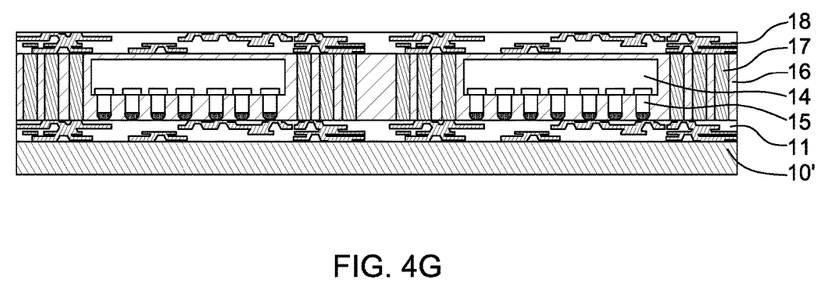
FIG. 4G illustrates some embodiments of a method of manufacturing a semiconductor device package according to some embodiments of the present disclosure.
Figure 4H:
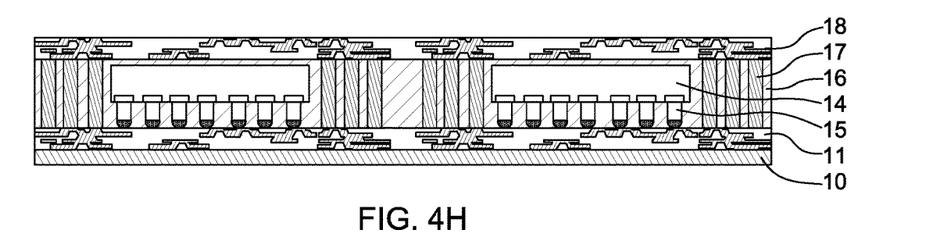
FIG. 4H illustrates some embodiments of a method of manufacturing a semiconductor device package according to some embodiments of the present disclosure.
Figure 4I:
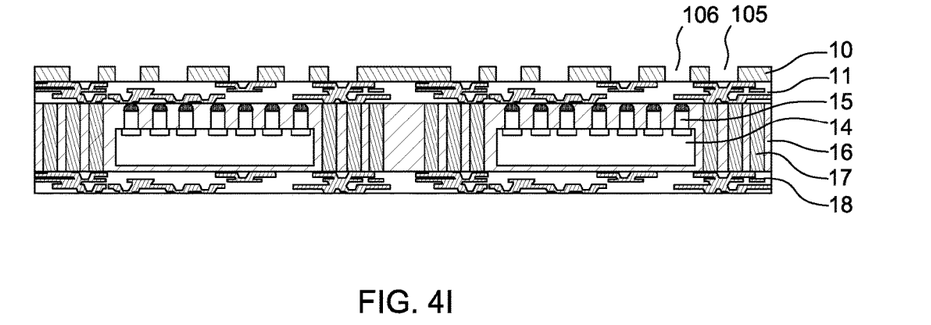
FIG. 4I illustrates some embodiments of a method of manufacturing a semiconductor device package according to some embodiments of the present disclosure.
Figure 4J:
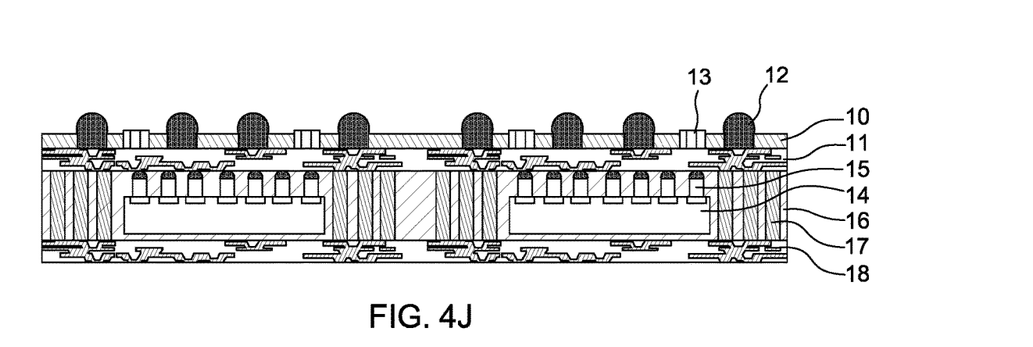
FIG. 4J illustrates some embodiments of a method of manufacturing a semiconductor device package according to some embodiments of the present disclosure.
Figure 4K:
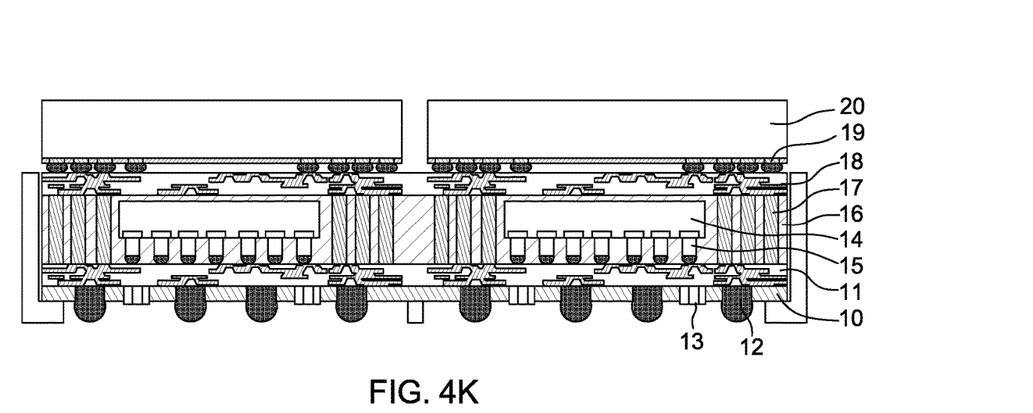
FIG. 4K illustrates some embodiments of a method of manufacturing a semiconductor device package according to some embodiments of the present disclosure.
Figure 4L:
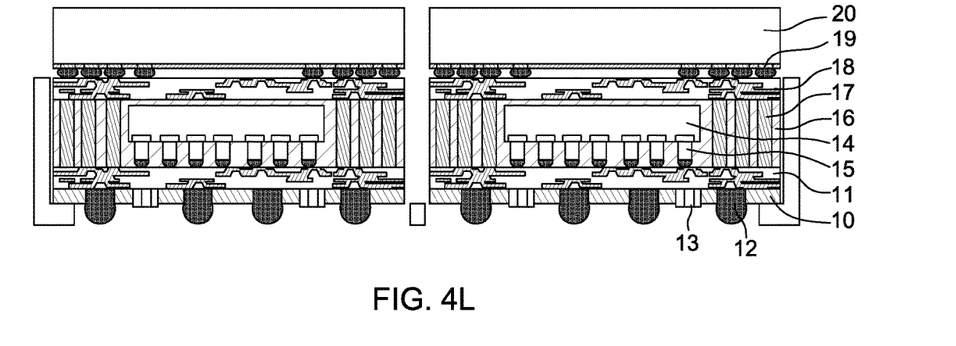
FIG. 4L illustrates some embodiments of a method of manufacturing a semiconductor device package according to some embodiments of the present disclosure.
Figure 4M:
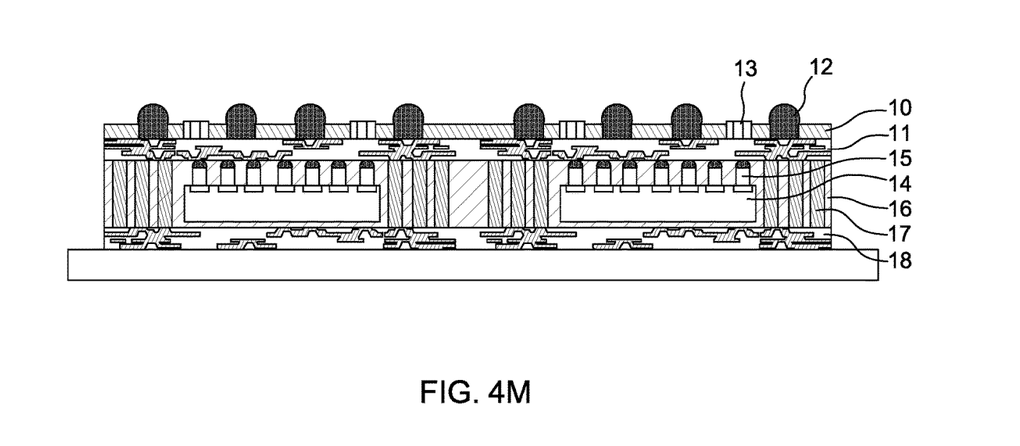
FIG. 4M illustrates some embodiments of a method of manufacturing a semiconductor device package according to some embodiments of the present disclosure.
Figure 4N:
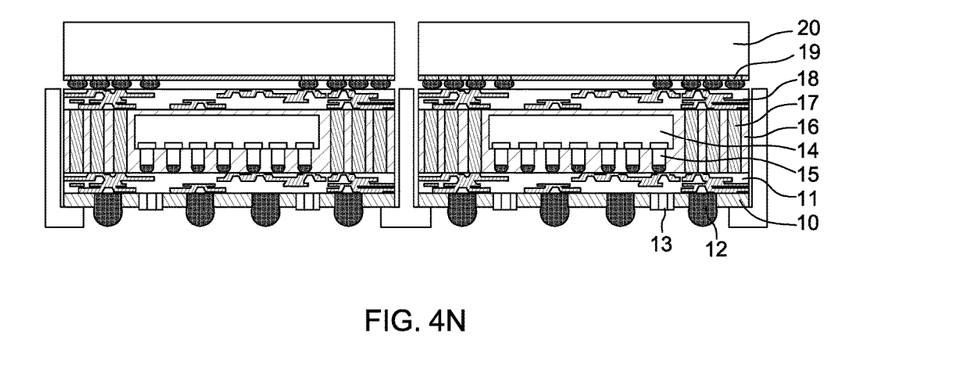
FIG. 4N illustrates some embodiments of a method of manufacturing a semiconductor device package according to some embodiments of the present disclosure.

FIG. 4A through FIG. 4N illustrate some embodiments of a method of manufacturing the semiconductor device package 2 according to some embodiments of the present disclosure.

Referring to FIG. 4A, a method for manufacturing a semiconductor device package includes providing a first lower encapsulation layer 10'. In some embodiments, the top surface of the first lower encapsulation layer 10' may be pre-grinded.

Referring to FIG. 4B, the lower redistribution structure 11 is formed or disposed on the first lower encapsulation layer 10'. In some embodiments, an insulation layer may be disposed directly on the first lower encapsulation layer 10', and the lower redistribution structure 11 may be formed or disposed by forming a through hole in the insulation layer to expose the first lower encapsulation layer 10', and forming a seed layer in the through hole and directly on the exposed first lower encapsulation layer 10'.

Referring to FIG. 4C, a through hole is formed in the lower redistribution structure 11 by, for example, a laser drilling technique so as to expose a portion of the lower redistribution structure layer 11. In some embodiments, the through hole may be formed in the lower redistribution structure 11 by a photolithography technique including an etching technique. Then, a seed layer is formed in the through hole of the lower redistribution structure 11. Subsequently, the second interconnection 17 is disposed or formed on the seed layer in the through hole of the lower redistribution structure 11. The second interconnection 17 may protrude from the through hole of the lower redistribution structure 11, as shown in FIG. 4C.

Referring to FIG. 4D, the first interconnection 15 is disposed or formed on the active surface of the die 14. The die 14 is disposed on the lower redistribution structure 11 and electrically connected to the lower redistribution structure 11 via the first interconnection 15. In some embodiments, the die 14 is disposed on the lower redistribution structure 11 after the first interconnection 15 is disposed or formed on the active surface of the die 14. Subsequently, a pre-mold baking operation is performed. A temperature at which at least part of the pre-mold baking operation is performed is in a range from approximately 100° C. to approximately 130° C.

Referring to FIG. 4E, a first upper encapsulation layer 16' is formed on the lower redistribution structure 11 to encapsulate the lower redistribution structure 11, the die 14, the first interconnection 15, and the second interconnection 17. Subsequently, a post-mold curing operation is performed. A temperature at which at least part of the post-mold curing operation is performed is in a range from approximately 120° C. to approximately 170° C.

Referring to FIG. 4F, the first upper encapsulation layer 16' is grinded by a grinding operation so as to expose at least a portion of the top surface of the second interconnection 17. After the grinding operation, the first upper encapsulation layer 16' is thinned, and is hereinafter referred to as the upper encapsulation layer 16.

Referring to FIG. 4G, the upper redistribution structure 18 is disposed or formed on the upper encapsulation layer 16.

Referring to FIG. 4H, the first lower encapsulation layer 10' is grinded by a grinding operation. After the grinding operation, the first lower encapsulation layer 10' is thinned, and is hereinafter referred to as the lower encapsulation layer 10.

Referring to FIG. 4I, a first opening 105 and a second opening 106 are formed in the lower encapsulation layer 10 by, for example, a laser drilling technique so as to expose a portion of the lower redistribution structure 11. In some embodiments, the first opening 105 and the second opening 106 may be formed in the lower encapsulation layer 10 by a photolithography technique including an etching technique. The size (e.g. a largest width) of the first opening 105 is smaller than the size of the second opening 106. A seed layer is formed in the first opening 105 of the lower encapsulation layer 10. Subsequently, the electrical connection terminal 12 is disposed or formed on the seed layer.

Referring to FIG. 4J, the electronic component 13 is disposed in the second opening 106 and subsequently the electrical connection terminal 12 is disposed in the first opening 105. In some embodiments, the electronic component 13 is disposed in the second opening 106 subsequent to the electrical connection terminal 12 being disposed in the first opening 105. The height of the electrical connection terminal 12 is greater than that of the electronic component 13. The lower encapsulation layer 10 may be substantially flat, which can help to ensure that the electrical connection terminal 12 and the electronic component 13 are disposed in the lower encapsulation layer 10 uniformly.

FIG. 4K and FIG. 4L show operations that lead to fabrication of the semiconductor device package 2. Referring to FIG. 4K, following the operations shown in FIG. 4J, the second die 20 is disposed on the upper redistribution structure 18 via the third interconnection 19 in a die-to-wafer manner. In some embodiments, the second die 20 is disposed on the upper redistribution structure 18 via the third interconnection 19 in a wafer-to-wafer manner.

Referring to FIG. 4L, a singulation operation is performed, thus completing fabrication of the semiconductor device package 2. In some embodiments, further operations may be performed to complete the semiconductor device package 2.

FIG. 4M and FIG. 4N show operations that lead to fabrication of the semiconductor device package 1. Referring to FIG. 4M, following the operations shown in FIG. 4J, the upper redistribution structure 18 of the semiconductor device package is disposed on a carrier (e.g. is directly disposed on the carrier).

Referring to FIG. 4N, a singulation operation is performed thus completing fabrication of the semiconductor device package 1. In some embodiments, further operations may be performed to complete the semiconductor device package 1. Subsequently, the second die 20 can disposed on the upper redistribution structure 18 of the semiconductor device package 1 via the third interconnection 19 in a die-to-die manner.

Figure 5:
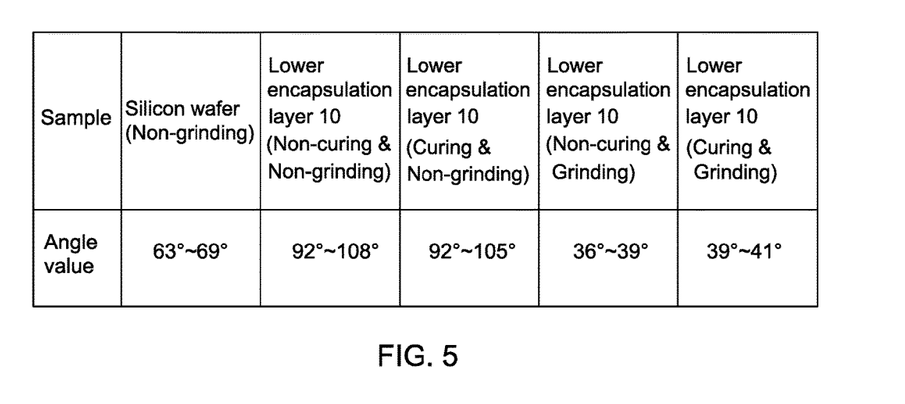
FIG. 5 is a table of contact angles of surfaces of carriers according to some embodiments of the present disclosure.

FIG. 5 is a table of contact angles, with respect to water, of the surfaces of a silicon wafer and the lower encapsulation layer 10 according to some embodiments of the present disclosure. The value of a contact angle of at least one surface of the silicon wafer without any grinding operation is in a range from approximately 63° to approximately 69°. The value of a contact angle of at least one surface of the lower encapsulation layer 10 (e.g. at least one of the top surface 101, the bottom surface 102, the lateral surface 103, and the lateral surface 104) without curing and grinding operations is in a range from approximately 92° to approximately 108°. The value of a contact angle of the at least one surface of the lower encapsulation layer 10 treated with a curing operation but without any grinding operation is in a range from approximately 92° to approximately 105°. The value of a contact angle of the at least one surface of the lower encapsulation layer 10 without any curing operation but treated with a grinding operation is in a range from approximately 36° to approximately 39°. The value of a contact angle of the at least one surface of the lower encapsulation layer 10 treated with curing and grinding operations is in a range from approximately 39° to approximately 41°.

Figure 6:
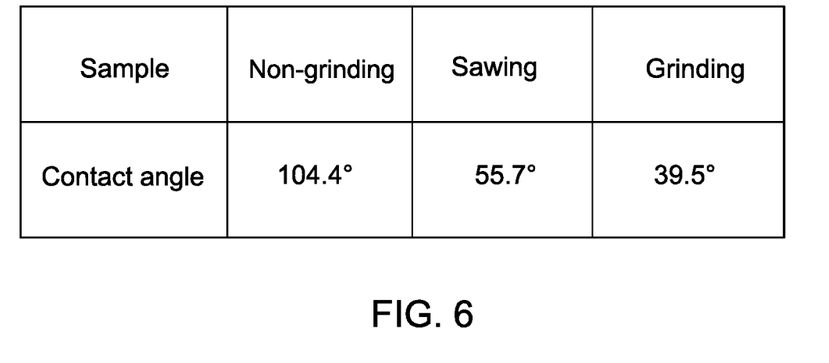
FIG. 6 is a table of contact angles of a surface of a mold compound carrier according to some embodiments of the present disclosure.

FIG. 6 is a table of contact angles of at least one surface (e.g. at least one of the top surface 101, the bottom surface 102, the lateral surface 103, and the lateral surface 104) of the lower encapsulation layer 10 according to some embodiments of the present disclosure. The value of a contact angle of the at least one surface of the lower encapsulation layer 10 without any grinding operation is approximately 104.4°. The value of a contact angle of the at least one surface of the lower encapsulation layer 10 treated with a singulation operation by a saw is approximately 55.7°. The value of a contact angle of the at least one surface of the lower encapsulation layer 10 treated with a grinding operation is approximately 39.5°.

Figure 7:
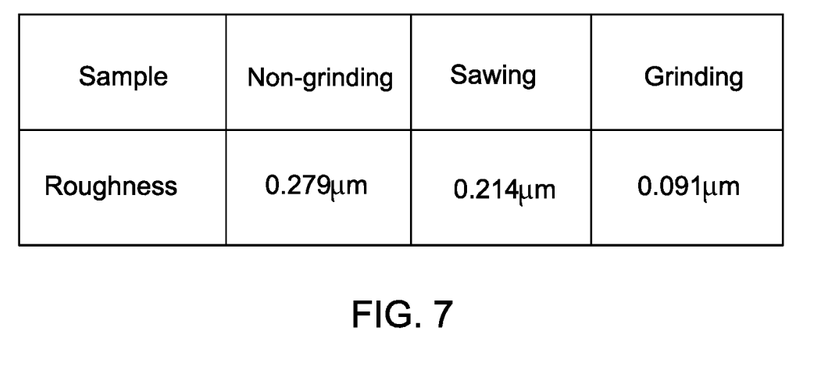
FIG. 7 is a table of roughness values of one surface of a mold compound carrier according to some embodiments of the present disclosure.

FIG. 7 is a table of roughness values of at least one surface (e.g. at least one of the top surface 101, the bottom surface 102, the lateral surface 103, and the lateral surface 104) of the lower encapsulation layer 10 according to some embodiments of the present disclosure. The value of a roughness of the at least one surface of the lower encapsulation layer 10 without any grinding operation is approximately 0.279 μm. The value of a roughness of the at least one surface of the lower encapsulation layer 10 treated with a singulation operation by a saw is approximately 0.214 μm. The value of a roughness of the at least one surface of the lower encapsulation layer 10 treated with a grinding operation is approximately 0.091 μm.

Figure 8:
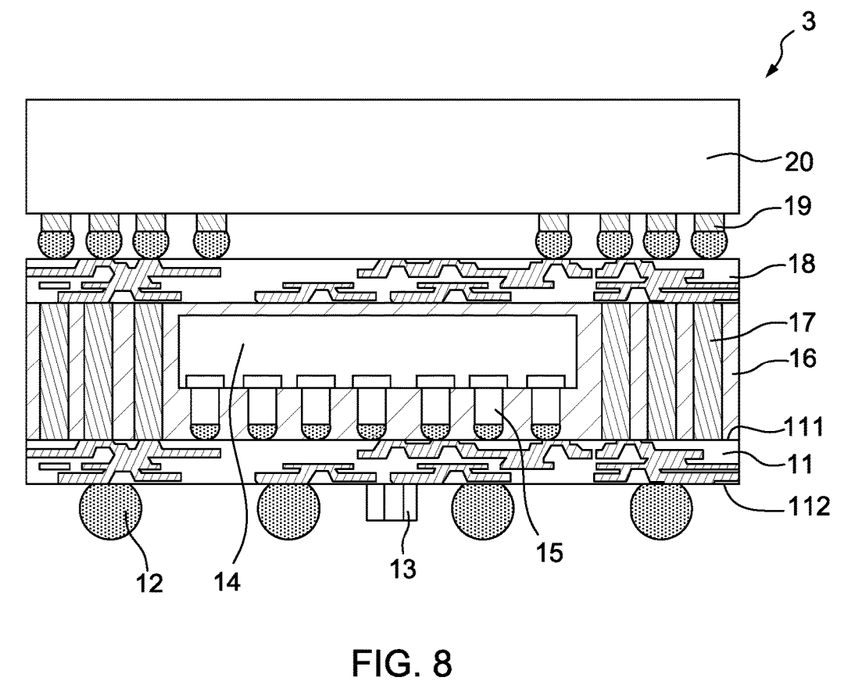
FIG. 8 illustrates a cross-sectional view of a comparative semiconductor device package.

FIG. 8 is a cross-sectional view of a comparative semiconductor device package 3. In the structure depicted in FIG. 8, the electrical connection terminal 12 and the electronic component 13 depicted in FIG. 8 are directly disposed on the lower redistribution structure 11 without support from a lower encapsulation layer 10. Since the electrical connection terminal 12 and the electronic component 13 are not supported on the lower redistribution structure 11, the electrical connection terminal 12 or the electronic component 13 may readily fall off of the semiconductor device package 3 due to stress or forces induced during molding operations.

As used herein and not otherwise defined, the terms "substantially," "substantial," "approximately" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within micrometers of lying along a same plane, such as within 40 µm, within 30 µm, within 20 µm, within 10 µm, or within 1 µm of lying along the same plane.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and the drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

What is claimed is:

1. A semiconductor device package, comprising:
    a first encapsulation layer having a first surface and a second surface different from the first surface;
    a redistribution layer disposed on the second surface of the first encapsulation layer;
    a first die disposed on the redistribution layer;
    a second encapsulation layer covering the first die and the redistribution layer; and
    an electrical connection terminal electrically connected to the redistribution layer,
    wherein the first encapsulation layer surrounds the electrical connection terminal and exposes a portion of the electrical connection terminal, and
    wherein a contact angle of the first surface of the first encapsulation layer is less than a contact angle of the second surface of the first encapsulation layer.

2. The semiconductor device package claim 1, wherein the first encapsulation layer comprises a filler and a resin.

3. The semiconductor device package claim 2, wherein the filler has a planar surface and the planar surface is exposed from the first surface of the first encapsulation layer.

4. The semiconductor device package claim 2, wherein a ratio of a height of the first encapsulation layer to a height of the electrical connection terminal is in a range from approximately 20% to approximately 40%.

5. The semiconductor device package claim 1, further comprising an electronic component, and wherein the electrical connection terminal is one terminal of an electronic component.

6. The semiconductor device package of claim 5, wherein the first encapsulation layer surrounds the electronic component and exposes a portion of the electronic component.

7. The semiconductor device package claim 1, further comprising an electronic component, and wherein the first encapsulation layer surrounds the electronic component and exposes a portion of the electronic component, and a height of the electrical connection terminal is greater than a height of the electronic component.

8. The semiconductor device package of claim 1, further comprising an electronic component, and wherein the first encapsulation layer defines a first opening to accommodate the electrical connection terminal and a second opening to accommodate the electronic component, and wherein the first opening is smaller than the second opening.

9. The semiconductor device package of claim 1, further comprising:
    an interconnection element disposed on the redistribution layer; and
    a second die disposed on the second encapsulation layer and electrically connected to the first die via the interconnection element.

10. A method for manufacturing a semiconductor device package, comprising:
    providing a first encapsulation layer;
    forming a redistribution layer on the first encapsulation layer;
    disposing a die on the redistribution layer;
    forming a second encapsulation layer encapsulating the die;
    thinning the first encapsulation layer subsequent to forming the second encapsulation layer;
    forming a first opening in the first encapsulation layer; and
    disposing an electrical connection terminal electrically connected to the redistribution layer in the first opening,
    wherein the first encapsulation layer surrounds the electrical connection terminal and exposes a portion of the electrical connection terminal.

11. The method of claim 10, wherein thinning the first encapsulation layer includes grinding.

12. The method of claim 10, wherein forming the first opening in the first encapsulation layer includes laser drilling.

13. The method of claim 10, further comprising forming a second opening in the first encapsulation layer, wherein the first opening is smaller than the second opening.

14. The method of claim 13, further comprising disposing an electronic component in the second opening prior to disposing the electrical connection terminal in the first opening.

15. The method of claim 13, further comprising disposing an electronic component in the second opening subsequent to disposing the electrical connection terminal in the first opening.

16. The method of claim 10, wherein forming the redistribution layer further comprises forming an insulation layer directly on the first encapsulation layer.

17. The method of claim 16, wherein forming the redistribution layer further comprises:
   forming a through hole in the insulation layer to expose the first encapsulation layer; and
   forming a seed layer in the through hole and directly on the exposed first encapsulation layer.

18. The method of claim 10, further comprising forming an interconnection element in the second encapsulation layer and electrically connecting the interconnection element to the redistribution layer.

\* \* \* \* \*